April 8, 1969 R. NELSON ET AL 3,437,576

PRODUCTION OF A COOLING MODULE FOR MICROELECTRONIC CIRCUITS BY CATHODIC SPUTTERING

Filed July 11, 1966

INVENTORS
RICHARD NELSON,
JOHN E. MC CORMICK.
BY Harry A. Herbert Jr. and Ruth Codier
ATTORNEYS United States Patent Office 3,437,576

Patented Apr. 8, 1969

3,437,576

PRODUCTION OF A COOLING MODULE FOR MICROELECTRONIC CIRCUITS BY CATHODIC SPUTTERING

Richard Nelson and John E. McCormick, Rome, N.Y., assignors to the United States of America as represented by the Secretary of the Air Force Filed July 11, 1966, Ser. No. 564,438

Int. Cl. C23c 15/00

U.S. Cl. 204—192 1 Claim

The invention described herein may be manufactured and used by or for the United States Government for governmental purposes without payment to us of any royalty thereon.

This invention relates to a thin film thermoelectric cooling module for microelectronic circuits and, more particularly, to a device and a method of combining thermoelectric cooling with microelectronic circuits for the purpose of dissipating heat generated in these circuits. In patterning microelectronic circuits and packing them into small spaces, in very close proximity to each other, objectionable and destructive heat is generated.

The object of the present invention is the provision of cooling means for alleviating this situation. A process has been evolved whereby the heat generated in these miniaturized circuits is drawn off or is eliminated. The method involves the inclusion of a device whereby thin film microelectronic circuits combine and utilize the phenomenon of thermoelectric cooling. A thermoelectric cooling module is built up on sections of the circuit, where cooling is desired, by techniques not hitherto used for this purpose and therefore new in miniaturized circuits.

When an electrical discharge is passed between electrodes at a low gas pressure, the cathode electrode is slowly disintegrated under the bombardment of the ionized gas molecules. This phenomenon is called cathodic sputtering. The disintegrated material leaves the cathode surface and is deposited on the anodic surface. The composition of this anode deposit is chemically identical to the composition of the cathode. The particles leaving the cathode may be either negatively charged or uncharged and may be single atoms or clusters of atoms.

The phenomenon of sputtering is highly undesirable and destructive in some electronic environments. The present invention proposes to utilize this phenomenon for the deposition on a circuit, compacted or otherwise of insulating oxides, pure metals and metallic compounds for the formation of modules capable of drawing off the heat.

As to the phenomenon of thermoelectric cooling, the net effect results from three distinct and separate phenomena, the Peltier effect, the Joule effect, and thermal conductivity.

Whenever an electric current flows in a circuit composed of two dissimilar conductors, heat is evolved at one junction and absorbed at the other, the process being thermodynamically reversible. This is the heat generated by the Peltier effect and is linear in the current in contrast to the irreversible Joule heat which is quadratic in the current. The Peltier effect causes the gross cooling and is independent of the dimensions of the thermoelectric element. The Peltier effect must overcome the Joule effect; which is equal to ½ the $I^2R$ loss in the thermoelectric material (half of the Joule heat goes to the cold junction, half to the hot) and is dependent on the dimensions of the element; and the conducted heat, which results when a temperature difference exists in a material, the flow of heat always being from the high temperature zone to the low temperature zone. The conducted heat is also greatly affected by the physical dimensions of the thermoelectric element. The difference between the Peltier heat and the sum of the Joule heat equals the net cooling of a thermoelectric junction. The determining factor in both the Joule and the conducted heat is the ratio between the cross sectional area of the thermoelectric element and the length of the element. The Joule heat decreases with increase in the $(A/l)$ ratio and the conducted heat in those cases where the current is $(A/l)$ ratio. The Joule heat is small when compared with the conducted heat in those cases where the current is less than 100 amperes and the $(A/l)$ ratio is greater than 1 cm.; therefore, the conducted heat is of primary concern. This heat of conduction, Qc in watts, is expressed by the equation, $$Q_c = k\frac{A}{l}\Delta T$$

where $k$ is the thermal conductivity of the material in watts/cm.° K. and $\Delta T$ is the temperature difference between the hot and cold junctions in degrees Kelvin. Then $k$ is a constant (at any given temperature), $(A/l)$ is fixed by the geometry of the couple, and $\Delta T$ is unknown.

The expression for the Joule heat, $Q_J$, in watts, is:

$$Q_J = \frac{1}{2}I^2\rho\frac{l}{A}$$

where I is the current flowing in amps, $\rho$ is the resistivity of the material is ohm-cm., and $(l/A)$ is the inverse of $(A/l)$. Then $\rho$ is a constant (at any given temperature), $(l/A)$ is fixed by the geometry of the couple, and I is unknown.

The expression for the Peltier heat, $Q_p$, in watts, is:

$$Q_p = \alpha I T_c$$

where $\alpha$ is the thermoelectric voltage in volts per degree Kelvin, $T_c$ is the cold junction temperature in degrees Kelvin, and I is the current in amps. Then $\alpha$ is constant (at a given temperature), $T_c$ is determined by the requirements of the system to be cooled, and I is unknown.

The power required to pump the net heat, $Q_n$, at a current I amps is equal to W watts. The expression for this power W, is $$W = I^2R_T$$

where $R_T$ is the total resistance of the thermoelectric module. This resistance includes the thermoelectric material resistance, the joint resistance, and the hot and cold strap resistance. In cases where $(A/L)$ is greater than 1 cm., all but the thermoelectric materials' resistance is negligible and will be disregarded in this analysis. Therefore $$W = I^2\rho\frac{L}{A}$$

where $\rho$ is the resistivity of the T-E material in ohm-cm.

The efficiency or coefficient of performance is equal to $Q_n/W$, and usually runs from 0.1 to 0.3 for various materials under various heat loads. Now the entire expression is:

$$COP=\frac{Q_n}{W}=\frac{Q_p-Q_j-Q_c}{W}$$

or $$Q_c=COP\times W+Q_j-Q_p$$

or $$k\frac{A}{L}\Delta T=COP\times I^2\rho\frac{l}{A}+\frac{1}{2}I^2\rho\frac{l}{A}-\alpha IT_c$$

Solving for ΔT, $$\Delta T=\frac{I^2\rho\frac{l}{A}\left(COP+\frac{1}{2}\right)\div\alpha IT_c}{k\frac{A}{l}}$$

For any given material, $\alpha$, $k$, and $\rho$ are known; for any given geometry $(A/l)$ is known. The cooling application determines $T_c$. The coefficient of performance is between 0.1 and 0.3 and can be assumed to be 0.2. By assuming various values for I, Delta T can be found.

In the case of a sputtered thermoelectric element the length of the element is, for example, three microns, and as we are concerned with a junction made up of two dissimilar materials, the effective length is six microns or 0.006 mm. The dissimilar materials may be, for example, P and N type bismuth telluride ($Bi_2Te_3$). The P type material is composed of 39 atomic percent bismuth and 61 percent tellurium. The N type is composed of 36 atomic percent bismuth and 64 atomic percent tellurium. The thermoelectric voltage, $\alpha$, equals $225\times10^{-6}$ volts/degree K.; the resistivity, $\rho$, equals $10^{-3}$ ohm cm.; and the thermal conductivity, $k$, equals $2.3\times10^{-2}$ watts/cm. degree K. These values are applicable when the cold junction temperature is 25° C. (298° K.).

These and other advantages, features and objects of the invention will become more apparent from the following description taken in connection with the illustrative embodiments in the accompanying drawings, wherein.

Figure 1:
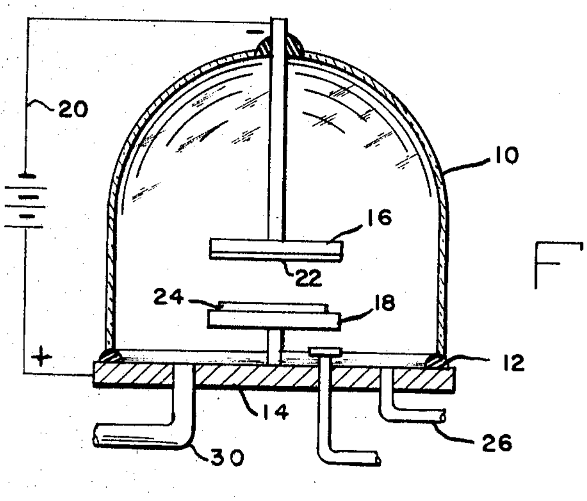
FIGURE 1 is a cross sectional view of a form of device wherein the sputtering operation takes place.

Referring more particularly to the drawings, FIGURE 1 shows a typical sputtering system and is included herein merely to exemplify a means of conducting the process, it being understood that other devices and materials may be used as found expedient. A vessel 10 which may be in the form of a bell jar is attached by means of a vacuum seal 12 to a conducting base 14. Because of its very low sputtering rate aluminum is presently the best material known for supporting structures within the confines of the system. An aluminum cathode 16 and an aluminum anode 18 are included in a circuit having D.C. potential and indicated schematically at 20. To the cathode 16 is attached a segment 22 of material to be deposited by sputtering. The anode 18 of aluminum or other conducting material provides a support for a substrate 24 upon which the material 22 is to be deposited.

Argon may be used as the low pressure area of the vessel 10, injected through inlet 26. A vacuum or pressure gauge is provided at 28, and an outlet is shown at 30 leading to vacuum pumps as desired. Air may be used in the low pressure area with materials that do not oxidize.

Figure 2:
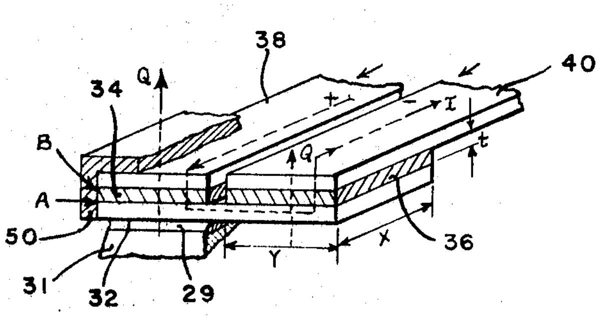
FIGURE 2 is a perspective enlarged view of a thin film thermoelectric cooling module wherein the sputtered elements are stacked.

The actual fabrication of a complete stacked type cooling module, as shown in FIGURE 2, can be accomplished in seven deposition operations. The first operation is the vacuum deposition of a thin film 29 of electrical insulation directly on the circuit or components 31 to be cooled. The surface of the circuit where depositions are not wanted is then masked so that the cold junction strap 32 may be either sputtered or evaporatively deposited. Metals with high thermal and electrical conductivities are used for the junction strap 32. The surface is again partially masked, and either one of the P and N straps 34 or 36 is deposited, and alternately masked for the deposit of the strap remaining. These deposits are thermoelectric material. The hot junction straps 38 and 40 are deposited alternately in the same way, being alternately masked for side by side placement. Before the hot junction straps 38 and 40 may be deposited, further electrical insulation must be vapor deposited. All of the surface except the T-E materials must be covered with this insulation, so that the danger of short circuits is eliminated. After masking and deposition of the hot junction straps, the entire outer surface is covered with a thin film of electrical insulation. In this arrangement, current and heat flows through the thermoelectric elements in a direction perpendicular to the surface of the circuitry upon which it is deposited. A radiant or convectively cooled heat sink indicated schematically at 50 in FIGURE 2 is then attached to the outer hot surface of the completed T-E module.

A multiple element cooling module, using existing sputtered films, fabricated by the above method would have, for example, about 50 junctions per square inch. Operating at 40 amps, this module would maintain a temperature difference of 3 to 5 degrees between the hot and cold junctions, and would remove from 10 to 25 watts of heat per square inch, with an input power of about 100 watts per square inch.

The greatest advantage of this type of T-E module is the reduction of thermal barriers between the electronic components to be cooled, and the thermoelectric cooler. The T-E joint resistance will lessen, because of the improved cohesion between the thermoelectric elements and the metallic hot and cold straps. This approach is effective only for cooling outer surfaces of devices, and cannot be used for heat sources embedded in a solid block of material.

Figure 3:
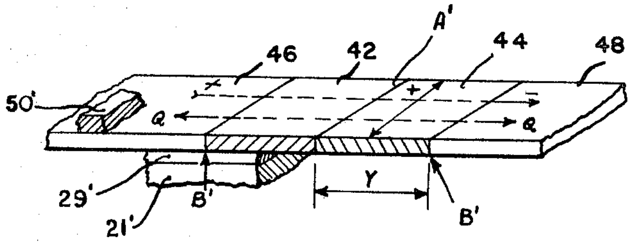
FIGURE 3 shows a modified geometric configuration wherein the elements are in-line between the hot and cold straps.

A modification capable of cooling point hot spots within a densely packed microelectronic device is shown in FIGURE 3. In this form the elements are in-line instead of stacked, and the heat flow is horizontal, or parallel to the circuitry surface instead of perpendicular to it as in the stacked form.

The fabrication of the in-line module of FIGURE 3 requires five depositions. The first step, as in the previously described method, is the vacuum deposition on the circuit 21 of a film of electrical insulation 29'. The surface is then masked to confine further depositions and the P and N type T-E materials 42 and 44 are alternately masked and sputtered. With further masking and sputtering the hot straps 46 and 48 are deposited. The elements 46 and 48 perform the double function of heat sink and conductor, and may be either sputtered as above described or vacuum deposited. A cold junction forms at A and a hot junction at B' and B'. The last step is to cover the entire surface except for contact points (not shown) on the heat sinks with a thin vacuum deposit of insulating film 50 and 50'.

Although the invention has been described with reference to a particular embodiment, it will be understood to those skilled in the art that the invention is capable of a variety of alternative embodiments within the spirit and scope of the appended claims.

We claim:

1. The method of producing a cooling module for microelectronic circuits, said process comprising: (1) sputter-depositing an electrical insulating metal oxide directly upon the microelectronic circuit to be cooled, (2) masking for deposition of material on a selected unmasked area, (3) forming a cold junction strap unit by sputtering, deposition of a metallic layer of high electrical and thermal conductivity, (4) masking alternately portions of said cold junction strap, (5) sputter-depositing side by side upon said cold junction strap and in separate operations an element comprising a thin layer of P type thermoelectric material and an element comprising a thin layer of N type thermoelectric material, (6) masking alternately said P type element and said N type element, and (7) sputter depositing hot junction straps upon both P and N type elements and finally providing a thin film of electrical insulation over the module thus produced.

References Cited

UNITED STATES PATENTS

| | | | |
|---|---|---|---|
| 2,984,077 | 5/1961 | Gaskill | 136—204 |
| 3,350,222 | 10/1967 | Ames et al. | 204—192 |
| 3,374,112 | 3/1968 | Danon | 204—192 |

ROBERT K. MIHALEK, *Primary Examiner.*

U.S. Cl. X.R.

117—210, 217, 200, 231, 107, 45; 136—203